United States Patent [19]

Levine et al.

[11] 4,430,150
[45] Feb. 7, 1984

[54] PRODUCTION OF SINGLE CRYSTAL SEMICONDUCTORS

[75] Inventors: Jules D. Levine, Dallas; William R. McKee, Plano; Kent R. Carson, McKinney, all of Tex.

[73] Assignee: Texas Instruments Incorporated, Dallas, Tex.

[21] Appl. No.: 290,917

[22] Filed: Aug. 7, 1981

[51] Int. Cl.³ .............................................. C30B 29/60
[52] U.S. Cl. .............................. 156/616 A; 156/616 R; 156/DIG. 105; 427/93
[58] Field of Search .............. 156/624, DIG. 64, 620, 156/617 R, 616 R, 607, 600, DIG. 105, DIG. 89, DIG. 67, DIG. 70, 617 M, 616 A; 423/348, 618, 624; 425/516; 264/7

[56] References Cited

U.S. PATENT DOCUMENTS

| | | | |
|---|---|---|---|
| 3,998,659 | 12/1976 | Wakefield | 136/89 R |
| 4,033,792 | 7/1977 | Giamei et al. | 156/600 |
| 4,040,849 | 8/1977 | Greskovich et al. | 423/348 |
| 4,188,177 | 2/1980 | Kilby et al. | 425/5 |
| 4,298,423 | 11/1981 | Lindmayer | 156/616 R |
| 4,377,605 | 3/1983 | Yamamoto | 427/93 |

Primary Examiner—Hiram H. Bernstein
Attorney, Agent, or Firm—Richards, Harris & Medlock

[57] ABSTRACT

Polycrystalline semiconductor material is treated to form a skin of a thermally stable substance and melted with the molten material retained by the film. Upon cooling, the material solidifies as single crystal and the skin is removed.

17 Claims, 4 Drawing Figures

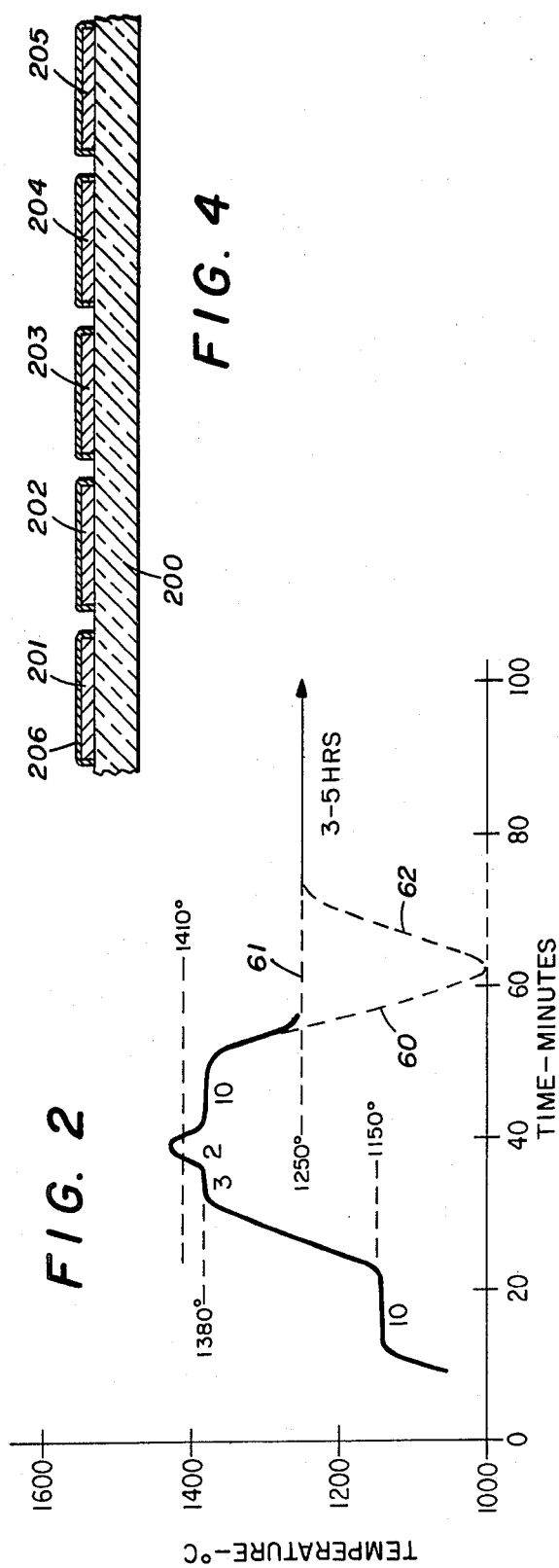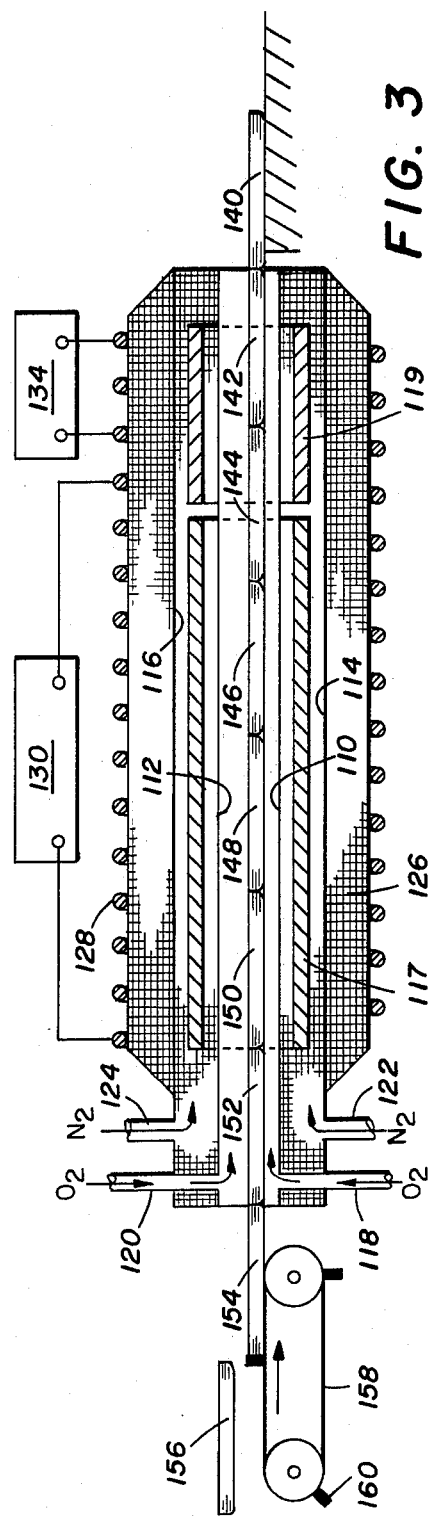

PRODUCTION OF SINGLE CRYSTAL SEMICONDUCTORS

TECHNICAL FIELD

This invention relates to the production of single crystal semiconductor material by forming an enveloping skin around polycrystalline or amorphous semiconductor material and then heating the semiconductor material within each enveloping skin to a molten state followed by cooling such that there is formed within the skin a single crystalline body. The skin is then removed.

BACKGROUND ART

The electrical characteristics of many semiconductor devices are significantly improved if the semiconductor material from which they are fabricated is of single crystal structure rather than of polycrystalline structure. This is especially true in the case of devices whose performance improves with increasing minority carrier lifetime.

It is well known that the boundaries between grains in polycrystalline semiconductor material are often populated by recombination centers for mobile charge carriers, and are thus effective in reducing minority carrier lifetime. Solar cells comprise one type of semiconductor device whose performance improves with minority carrier lifetime. Generally, the photoresponse of semiconductor solar cells is more favorable in larger grain size material. Material of a single cryatal form free of grain boundaries is optimum. Semiconductor devices other than solar cells similarly benefit from use of single crystal materials.

To obtain single crystal semiconductor material for fabrication of devices, it is common practice in the semiconductor industry to melt or vaporize the material and then cool it in contact with a solid single crystal seed of the same or a similar material. As the molten or vaporized material cools, it solidifies epitaxially at the interface with the seed such that the single crystal morphology of the seed is propagated. In this way, the molten or vaporized material is converted to single crystal form.

In one version of the foregoing process, a seed is slowly withdrawn from a melt and supports a single crystal ingot. In another version, a laser is used to locally melt a layer of polycrystalline material deposited on an underlying single crystal seed substrate. In a third version, the material is chemically vapor deposited on a single crystal seed substrate usually at an elevated temperature. The main drawback of all these processes is the requirement for a single crystal seed.

DISCLOSURE OF THE INVENTION

This invention relates to a method for conversion of polycrystalline or amorphous semiconductor material to single crystal form without the benefit of a single crystal seed. A specific embodiment of this method that has been found to operate satisfactorily relates to production of small single crystal spheres of silicon suitable for use in solar cells or other photovoltaic devices. The invention involves producing single crystal semiconductor bodies from irregular bodies of polycrystalline material. The material is coated with a skin of dissimilar material; the material inside each skin is then melted and thereafter cooled in such a way that the molten material solidifies in a single crystal structure. The skin may then be removed.

BRIEF DESCRIPTION OF THE DRAWINGS

For a further understanding of the invention, reference may now be had to the following description taken in conjunction with the accompanying drawings in which:

FIG. 2 is a graph illustrating a time temperature profile for the process of FIG. 1;

FIG. 3 illustrates a continuous process; and

FIG. 4 illustrates a modification of the invention in which platelets are produced.

DETAILED DESCRIPTION

Figure 1:
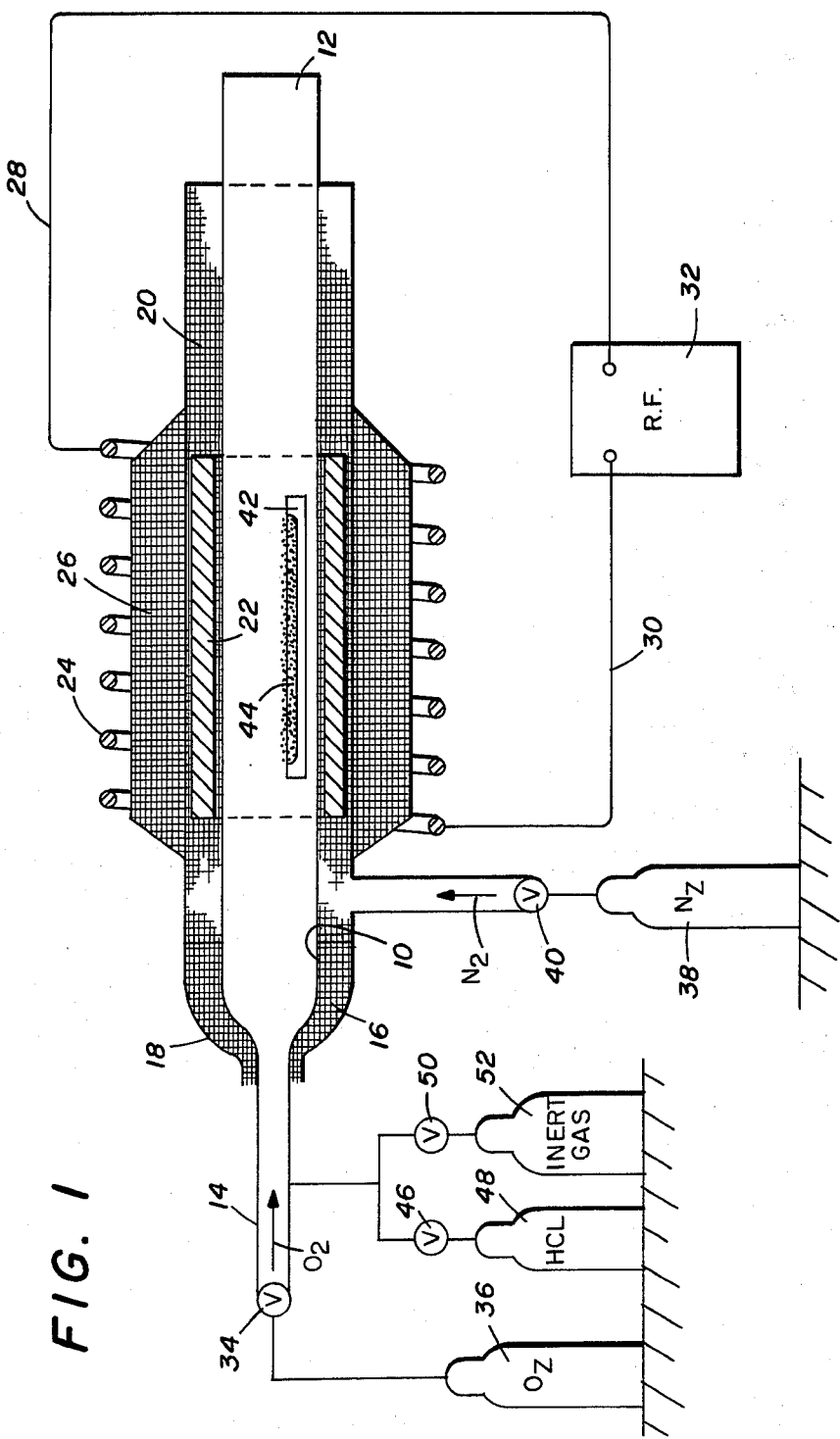
FIG. 1 schematically illustrates the process of the present invention.

Treatment of polycrystalline semiconductor bodies, in accordance with the present invention, may provide a yield of nearly 100% single crystals. The process may be understood by reference to FIG. 1 which illustrates an apparatus for processing silicon. A hollow inner quartz tube 10 is open at end 12 and at the other end is necked down to a smaller diameter portion 14. Tube 10 is nested inside of a larger tube 16. Tubes 10 and 16 are maintained in coaxial relation by means of quartz wool bodies 18 and 20.

A graphite cylinder 22 encircles tube 10 and is located inside tube 16. Cylinder 22 has an inner diameter slightly larger than that of tube 10 and an outer diameter slightly smaller than the inner diameter of tube 16. The graphite cylinder 22 serves as a heat susceptor when positioned in the annulus between tubes 10 and 16. A radio frequency heating coil 24 is positioned coaxial with cylinders 10, 16 and susceptor 22. It encompasses and heats susceptor 22. A cylinder 26 of quartz wool surrounds tube 16 between coil turns 28 and 30. Coil 24 is connected to a selectively variable radio frequency power source 32 for controlled heating of susceptor 22.

Section 14 of tube 10 is connected by way of a regulating valve 34 to a source 36 of oxygen so that a predetermined flow of oxygen from source 36 is maintained through tube 10. Section 14 of tube 10 is also connected by way of a regulating valve 46 to a source 48 of HCl gas and by way of regulating valve 50 to a source 52 of inert gas. Similarly, a source 38 of nitrogen is connected through a flow regulating valve 40 leading to the annulus between tubes 10 and 16 so that the susceptor 22 is maintained in a non-oxidizing atmosphere.

A quartz boat 42 is nested in tube 10 at a central location relative to susceptor 22.

A charge of starting material 44 loaded in boat 42 is preferably constituted of semiconductor grade silicon particles doped to the desired resistivity. The material 44 in boat 42 can be of any crystal structure such as single crystal, polycrystalline or amorphous structures. Preferably, the small particles correspond in volume to that of a sphere of about 0.025 centimeters in diameter. Preferably they will be near spherical in shape but can be other shapes.

The silicon starting material may be produced by one of many atomization processes such as the process described, for example, in U.S. Pat. No. 4,188,177. Suitable particles may also be made by crushing polycrystalline silicon and screening the same to obtain particles of desired size.

Silicon particles of arbitrary crystal structure are placed in boat 42 which is positioned in cylinder 10. Energy is then supplied from source 32 by way of heating coil 24 while inert gas flows from source 52 and HCl gas flows from source 48 and nitrogen flows from source 38.

In order to clean the particles in boat 42, the temperature of the particles is elevated to a temperature below the melting point of silicon.

One atmosphere of the inert gas Argon mixed with about 5% HCl gas is maintained for about 10 minutes at a temperature of about 1150° C. At such temperature, the mixture of inert gas and HCl gas removes contaminants from their surfaces.

Valves 46 and 50 are then closed and valve 34 is opened such that oxygen is supplied from source 36. The temperature of the semiconductor material in boat 42 is then elevated to a higher temperature though still below the melting point of silicon in order to form an oxide film on the particle surfaces. The particles preferably are oxidized at one atmosphere of oxygen for about 25 minutes. The temperature for this operation is preferably about 1380° C. At such temperature, while in an oxygen atmosphere, strong oxidizing action takes place and a thin silicon dioxide layer forms on the outer surface. A silicon dioxide skin or crucible grows on each particle to retain the silicon when later at higher temperatures, it becomes molten.

The particles are then raised to a temperature preferably of about 1430° to 1500° C. but not above 1550° C. at one atmosphere of $O_2$ pressure and retained at that temperature for about 2 minutes while melting of the semiconductor material takes place. This operation is in an atmosphere of oxygen which will act to reseal any rupture that may develop and will otherwise aid in maintaining the integrity of the skin by continuously oxidizing the silicon. The skin also prevents adjacent particles from coalescing while the selfpackaged silicon is in the molten state.

When molten, each individual particle tends to change its shape to become a spherical in character because of the surface tension forces which are present. The thin $SiO_2$ skin is sufficiently plastic at this temperature to allow the particles to spheroidize.

After the particles have become molten, the heating energy from coil 24 is reduced and the molten spheres are cooled.

The cooling rate of the silicon particles through the melting point in this process is inherently slow which favors single crystal growth. Nearly 100% of the remelted spheres produced by this process are single crystal and essentially defect-free.

While spherical particles can be produced with extremely rapid cooling rates, the percentage of polycrystalline spheres produced typically increases as cooling rate decreases. Reasonable yields of single crystal particles can be obtained by simply withdrawing boat 42 from the furnace into an environment at ambient temperature.

Silicon expands upon solidification so that a sphere thus produced may have a slight point on the last-to-freeze end of the particle. However, the $SiO_2$ skin has been found to be sufficiently plastic to allow the silicon to expand upon solidification without rupturing the skin. The particles solidify before significant supercooling occurs and thus a high yield of single crystal spheres is produced.

After the boat 42 is removed from the furnace, the skins may be removed chemically by etching in hydrofluoric acid as is well known in the art.

It has been found that several layers of spheres may be placed in boat 42. This is possible because the skin grown on the silicon particle will prevent one particle from coalescing with its neighbor and thus particles may be stacked or piled up. A charge that is several sphere diameters deep can be melted without significant sticking of one sphere to another. Actually, a given particle needs to be above 1410° C. for only a few seconds but for production purposes where particles are stacked, 2 minutes residence time at 1430° C. assures uniformity of product. This is sufficient time to allow all particles to melt and spheroidize.

To facilitate mass production, the particles can be pre-oxidized to form the skin thereon in a preconditioning furnace or in a cooler portion of a single furnace. However, in FIG. 1, only a single stage furnace has been shown. It is to be noted that HCl gas/inert gas pretreatment may not be required if the particles are extremely clean at the start.

When processing large quantities of silicon spheres at a given time, it may be desired to stir the spheres during the oxidation stage so that all surfaces of the particles are uniformly oxidized. They must not be stirred while molten.

The process of melting silicon in an $SiO_2$ skin results in the incorporation of large quantities of oxygen into the silicon. this can degrade the electrical properties. To eliminate this problem, the oxygen content of the particles can be reduced by heating the spheres in an oxygen ambient at 1250° C. for 3–5 hours. This can be done simply by lowering the temperature of the melting furnace or, to facilitate mass production, by annealing in a separate furnace.

If oxygen removal is carried out in a separate furnace, the spheres which are cooled slowly to a point below the melting point of silicon should be rapidly cooled and later should be reheated rapidly to avoid formation of nuclei upon which the dissolved oxygen will precipitate during subsequent heat treatment. If oxygen is not removed, it precipitates on further thermal processing to form oxygen precipitate induced stacking faults throughout each particle and the latter have been found to be the source of degradation.

If the oxygen is removed by annealing, the minority carrier lifetime will remain high. In such case, the photovoltaic response of the silicon sphere will not be affected by oxygen.

Thus, in this process, silicon particles in the shape of spheres or of other shapes are simply loaded onto a flat boat and moved through a furnace controlled in temperature. The furnace ambient is purged with the reactive gas that grows a skin on each particle. The high temperature reaction in the furnace causes the skin to form and then all the silicon particles are made to be molten. With oxygen gas used as the reactive gas before melting, a silicon dioxide film is formed on each particle from the furnace oxygen ambient. During melting, the outside skin remains intact and retains the molten silicon. The thin silicon dioxide skin is plastic at this temperature, allowing the droplet to spheroidize. The surface also loses texture and becomes shiny smooth.

It has been found desirable to coat the quartz boat 42 with $Si_3N_4$ to minimize adhesion of the spheres to the boat.

It will be understood that other furnace construction materials such as $Al_2O_3$, SiC, $Si_3N_4$, etc. may be employed in place of quartz. Further, the furnace may be resistively heated rather than RF heated as above described.

While use of oxygen gas has been described as the oxidizing ambient in the furnace, $N_2O$ or other gases may also be suitable. $Si_3N_4$ or SiC skins may also be formed with the appropriate nitrogen or carbon bearing gases employed in tube 10.

FIG. 2

FIG. 2 illustrates time-temperature relations employed in treating silicon.

Referring to FIG. 2, silicon particles are first heated to a temperature of about 1150° C. for about 10 minutes. The temperature in the furnace is then elevated to about 1380° C. and maintained at the temperature of 1380° C. for about 3 minutes. The temperature then is raised preferably to about 1430° C. which is 20° above the melting point of silicon and is maintained for about 2 minutes. The temperature is then reduced to 1380° C. and held for about 10 minutes. The temperature then is permitted to return to ambient as indicated by the dotted line 60.

Alternatively, the temperature in the furnace may be reduced to about 1250° C. as indicated by the dotted line 61 and the particles held at that temperature for a period of several hours. Practical and productive utilization of the furnaces suggests that the charge rendered molten and then permitted to cool should be returned to ambient temperature. Thereafter the charge would be transferred to a different carrier and placed in a different furnace which would anneal the particles at 1250° C. for several hours, as indicated by the dotted line 62. Thus, FIG. 2 illustrates two alternatives, (1) where a single furnace is used and (2) where one furnace is used to form the skin and melt the silicon within the skin, followed by slow cooling to a temperature below the melting point and then rapid cooling down to ambient temperature to be followed by annealing in a second furnace.

FIG. 3

In FIG. 3, a continuous process is illustrated. The furnace of FIG. 3 comprises an inner compartment having a bottom wall 110 and a top wall 112. The inner compartment is surrounded by an outer compartment having a bottom wall 114 and a top wall 116. The compartments may be rectangular with substantial widths and need not be cylindrical as was the case of FIG. 1. Susceptor structures 117 and 119 are located in the spaces between the inner and outer compartments. Oxygen is fed into the inner compartment by way of tubes 118 and 120. Nitrogen is fed into the spacing between the inner and outer compartments by way of tubes 122 and 124. A quartz wool body 126 coats or surrounds the outer compartment. A first RF heating coil 128 is powered from an RF supply source 130. A second RF heating coil 132 is powered from an RF supply source 134.

A plurality of boats 140-154 travel on a track inside the inner compartment. The boats are propelled by a feed unit comprising a driven belt 158 having cleats 160 which engage the trailing end of each boat as it is placed in position to enter the furnace. Boat 156, for example, is shown in position to be placed onto belt 158 as boat 154 enters the furnace through an end gate. The boats may travel at a uniform rate through the furnace. The furnace is adjusted by control of the heating coils 128 and 132 so that the first section within susceptor 117 and coil 128 will be maintained at about 1380° C. for 25 minutes and boats within susceptor 119 and coil 132 will be maintained at a temperature of 1430° C. for about 2 minutes, following which they emerge from the furnace, whereupon the particles are cooled.

While the foregoing example has dealt with the treatment of silicon to produce single crystal silicon spheres, it is to be understood that other semiconductors may be similarly treated.

The skin should be such that it is not rapidly dissolved by the semiconductor and has plasticity at the melting point.

In forming single crystal germanium, the gas in the furnace during the period of growth of the skin would be silane ($SiN_4$) plus anhydrous ammonia ($NH_3$) plus Argon. The growth of the skin would involve subjecting the germanium particles to the above gases at 800° C. for about 5 minutes then to a temperature of 950° C. for about 2 minutes then at a temperature of about 800° C. for a few minutes and then to ambient temperature.

Further, the semiconductor gallium arsenide may be produced in single crystal form. In such case, silicon nitride, silicon dioxide or silicon carbide may be applied by chemical vapor deposition to form the skin.

The foregoing description has dealt with the production of semiconductor spheres of single crystalline form. It is to be understood that single crystals of shape other than spherical can be produced within the scope of the present invention.

FIG. 4

FIG. 4 illustrates single crystal semiconductor platelets formed on a substrate. A substrate 200 of silicon nitride or quartz or like material is first coated with a continuous coat of a semiconductor material such as silicon about 5 to 10 mils thick. The silicon is then etched in conventional manner to form islands of separate and distinct plates—for example, plates one-quarter of an inch square on the upper face of the substrate 200. Platelets 201-205 are shown on the upper surface of the substrate 200.

Thereafter, in accordance with the present invention, a time-temperature-reactant regime such as illustrated in FIG. 2 is followed whereby a coating such as coating 206 is formed on each of the platelets 201-205. After forming the coating 206, the temperature of the platelets is elevated so that they become molten but are retained intact by the action of the skins 206. After melting, the temperature is reduced as shown in FIG. 2 so that the particles are solidified and then are reduced to ambient temperature. The substrate may then be diced so that single crystal platelets 201-205 are available for such use as may be desired of such a product. Integrated circuits may be formed thereon or other desired operations are carried out where use of single crystal platelets is advantageous.

Having described the invention in connection with certain specific embodiments thereof, it is to be understood that further modifications may now suggest themselves to those skilled in the art and it is intended to cover such modifications as fall within the scope of the appended claims.

We claim:

1. The method comprising:

(a) treating a polycrystalline semiconductor material in a reactive gaseous environment to form a skin thereon of a thermally stable compound;

(b) thereafter melting the material within said skin while in said gaseous environment with the molten material retained within said skin; and (c) cooling the material to form a solid single crystal body within said skin.

2. The method of claim 1 wherein said material is one of the class comprising silicon, germanium and gallium arsenide.

3. The method of claim 1 wherein said material is silicon and said environment is an oxidizing gas.

4. The method of claim 1 wherein said material is germanium and said environment is a gaseous atmosphere of silane and ammonia.

5. The method of claim 1 wherein said material is gallium arsenide and the skin is formed by chemical vapor deposition.

6. A method for producing particles of single crystal semiconductor material from irregular particles of polycrystalline material, comprising the steps of:

(a) heating said polycrystalline particles to a temperature below the melting point thereof in an environment containing a reactive gas capable of growth of a coating over the surface of each particle;

(b) heating said polycrystalline materials inside each said coating to a temperature above the melting point of said crystalline material in the presence of a reactive gas which maintains the integrity of said coating; and (c) cooling the particles to allow the molten material to solidify in a single crystal structure within said coating.

7. The method set forth in claim 6, wherein polycrystalline particles of silicon are heated in an oxygen environment, to grow a silicon dioxide skin.

8. The method set forth in claim 6, wherein polycrystalline particles of silicon are heated in a nitrogen containing gas environment, to grow a silicon nitride skin.

9. The method set forth in claim 6, wherein polycrystalline particles of silicon are heated in a carbon containing gas environment to grow a skin of silicon carbide.

10. The method of producing particles of single crystal silicon from the particles of polycrystalline silicon, comprising the steps of:

(a) heating said polycrystalline silicon particles to a temperature below 1410° C. in an environment containing a reactive gas for growth of a silicon compound coating over the surface of each particle;

(b) heating the materials inside said coatings to a temperature above 1410° C. to melt said materials in the presence of a reactive gas to maintain the integrity of said coating;

(c) cooling the particles to allow the molten silicon to solidify in a single crystal structure within said coating; and (d) annealing said particles for removal of contaminants in the material inside said skin.

11. The method as recited in claim 10, wherein the particles are heated in an oxygen environment to grow a silicon dioxide skin.

12. A method of producing particles of single crystal silicon from particles of polycrystalline silicon, comprising the steps of:

(a) exposing said particles to a mixture of a carrier gas and hydrogen chloride gas at an elevated temperature below the melting point of silicon to clean the surfaces of said particles;

(b) elevating the temperature of the cleaned particles to slightly below 1410° C. in a gaseous environment containing oxygen which will react to grow a continuous silicon dioxide coating over the surface of each said particle;

(c) thereafter further elevating the temperature of said particles in the presence of a reactive gas to melt the polysilicon material inside the coating of each said particle; and (d) cooling the particles to allow the molten silicon to solidify in a single crystal structure within said coating.

13. The method set forth in claim 12, wherein the polycrystalline particles are heated in an oxygen environment, to grow a silicon dioxide skin.

14. The method set forth in claim 12, wherein the polycrystalline particles are heated in a nitrogen containing environment, to grow a silicon nitride skin.

15. The method set forth in claim 12, wherein the polycrystalline particles are heated in a carbon containing gas environment to grow a silicon carbide skin.

16. A method of producing particles of single crystal silicon from particles of polycrystalline silicon, comprising the steps of:

(a) oxidizing the polysilicon particles by heating at about 1380° C. in an environment containing oxygen for about 3 minutes to grow a continuous silicon dioxide coating over the surface of each particle;

(b) elevating the temperature of the polycrystalline materials inside the coating of each said particle to about 1430° C. for about 2 minutes while in said oxygen environment; and (c) cooling the particles to about 1380° C. for about 10 minutes to allow the molten silicon to solidify in a single crystal structure within said coating.

17. The method set forth in claim 16, wherein the particles are thereafter annealed at a temperature of about 1250° C. for a period of several hours to remove dissolved oxygen from the single crystal particles.

* * * * *